United States Patent
Saito et al.

(10) Patent No.: US 6,806,743 B2
(45) Date of Patent: Oct. 19, 2004

(54) SEMICONDUCTOR INTEGRATED CIRCUIT DEVICE

(75) Inventors: Kayoko Saito, Hamura (JP); Mitsugu Kusunoki, Kunitachi (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 10/360,868

(22) Filed: Feb. 10, 2003

(65) Prior Publication Data

US 2003/0160639 A1 Aug. 28, 2003

(30) Foreign Application Priority Data

Feb. 22, 2002 (JP) ........................................ 2002-046740

(51) Int. Cl.$^7$ .............................................. H03F 3/45
(52) U.S. Cl. ................................ 327/55; 327/52; 327/65
(58) Field of Search ............................... 327/55, 52, 65, 327/108

(56) References Cited

U.S. PATENT DOCUMENTS

| | | | |
|---|---|---|---|
| 4,958,133 A | 9/1990 | Bazes | 330/253 |
| 5,696,726 A | * 12/1997 | Tsukikawa | 365/205 |
| 5,815,020 A | * 9/1998 | Allen et al. | 327/255 |
| 5,977,827 A | * 11/1999 | Dick | 330/252 |
| 6,549,971 B1 | * 4/2003 | Cecchi et al. | 327/55 |

OTHER PUBLICATIONS

Mel Bazes, "Two Novel Fully Complementary Self–Biased CMOS Differential Amplifiers", IEEE Journal of Solid-State Circuits vol. 26, No. 2, Feb. 1991, pp. 165–168.
Translation of "Internal Operation of a Rail–to–Rail Operational Amplifier", Transistor Technology, Mar. 2001, p. 201.

* cited by examiner

Primary Examiner—Tuan T. Lam
Assistant Examiner—Hiep Nguyen
(74) Attorney, Agent, or Firm—Reed Smith LLP; Stanley P. Fisher, Esq.; Juan Carlos A. Marquez, Esq.

(57) ABSTRACT

The present invention provides a semiconductor integrated circuit device equipped with an input circuit capable of stably performing a high-speed operation up to a low voltage. A rail to rail circuit constitutes a differential input circuit, and a circuit similar to such a differential input circuit is used to constitute a bias circuit. A pair of output terminals of a differential circuit constituting such a bias circuit is commonly connected to form a bias voltage corresponding to a middle point. The bias voltage is supplied to the gates of current source MOSFET and the gates of cascode-connected MOSFETs in the differential input circuit, and the gates of the corresponding current source MOSFETs and cascode-connected MOSFETs in the bias circuit corresponding to itself.

20 Claims, 13 Drawing Sheets

SEMICONDUCTOR INTEGRATED CIRCUIT DEVICE

BACKGROUND OF THE INVENTION

The present invention relates to a semiconductor integrated circuit device, and to a technology effective for application to an input circuit of a semiconductor integrated circuit device, which is supplied with an input signal of small amplitude.

A differential input circuit has generally been used for an input circuit which receives an input signal of small amplitude therein and needs to operate at high speed. However, a problem arises in that when an input voltage Vin becomes low like Vin<2×Vth (threshold voltages of differential MOSFETs and current source MOSFET), a current of the current source MOSFET provided at common sources of the differential MOSFETs decreases and hence a normal operation cannot be carried out.

SUMMARY OF THE INVENTION

The inventors of the present application have focused attention on the rail to rail (rail to rail is a trademark of US Motorola, Inc.) circuit capable of operation even if an input signal is shifted to a source or power supply voltage or a circuit ground potential. FIG. 13 shows a circuit diagram of a rail to rail circuit discussed prior to the present invention. The present circuit needs bias P1, P2, N1, N2, and DCP and DCN. Considering process variations in devices, e.g., variations in mutual conductance ratio between P channel MOSFETs and N channel MOSFETs, and a shift in input voltage Vin, it is difficult to use the present circuit as a small-amplitude and high-speed input circuit as it is.

A circuit diagram of a self-bias type rail to rail circuit, which has been proposed by U.S. Pat. No. 4,958,133, is shown in FIG. 14. Further, an example in which a rail to rail circuit is used in an op amplifier, has been shown in Magazine "Transistor Technology", March 2001, pp. 201. Since these circuits are slow in signal transfer rate even if they can be used as op amplifiers, these circuits are unfit for an input circuit for inputting an address signal a clock signal and various control signals employed in a static RAM (Random Access Memory) which calls for a high-speed operation.

An object of the present invention is to provide a semiconductor integrated circuit device equipped with an input circuit capable of stably performing a high-speed operation up to a low voltage. The above, other objects and novel features of the present invention will become apparent from the description of the present specification and the accompanying drawings.

A summary of a typical one of the inventions disclosed in the present application will be described in brief as follows: A first differential MOSFET pair of first conductivity type whose gates are respectively connected to first input terminals, and a first current source MOSFET of first conductivity type which is provided at common sources of the first differential MOSFET pair and forms an operating current, constitute a first amplifying unit. A second differential MOSFET pair of second conductivity type whose gates are respectively connected to the pair of first input terminals and a second current source MOSFET of second conductivity type which is provided at common sources of the second differential MOSFET pair and forms an operating current, constitute a second amplifying unit. A first output unit including a first MOSFET pair of second conductivity type which supplies a current flowing through the first differential MOSFET pair, and a second output unit including a second MOSFET pair of first conductivity type which supplies a current flowing through the second differential MOSFET pair, are provided to constitute an amplifier circuit. A circuit similar to such an amplifier circuit is used to constitute a device circuit. A pair of output terminals thereof is connected in common to form a bias voltage corresponding to a middle point. Such a voltage is supplied to the gates of the first and second current source MOSFETs of the amplifier circuit, the gates of the first and second MOSFETs thereof, and the gates of the corresponding current source MOSFET and MOSFET of the bias circuit.

DETAILED DESCRIPTION OF THE PREFERRED EMBODIMENTS

Figure 1:
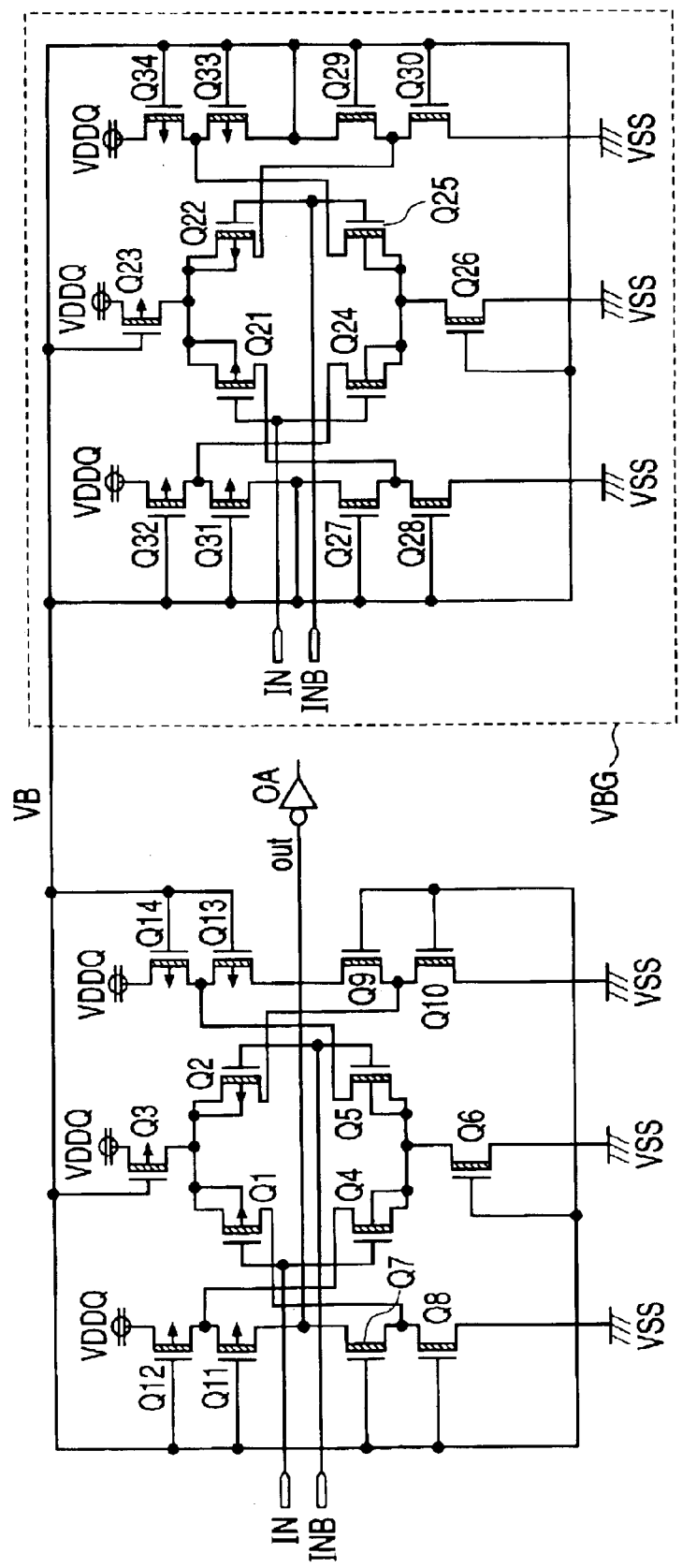
FIG. 1 is a circuit diagram showing one embodiment of an input circuit provided in a semiconductor integrated circuit device according to the present invention.

A circuit diagram of one embodiment of an input circuit provided in a semiconductor integrated circuit device according to the present invention is shown in FIG. 1. Respective circuit elements shown in the same drawing are formed on a single semiconductor substrate like monocrystalline silicon by the known semiconductor integrated circuit manufacturing technology. The circuit shown in the same drawing comprises a CMOS circuit made up of N channel MOSFETs and P channel MOSFETs. The P channel MOS- FETs are distinguished from the N channel MOSFETs by marking their backgate (channel) portions with arrows.

The input circuit according to the embodiment makes use of the rail to rail circuit. That is, a first amplifying unit comprising P channel type differential MOSFETs Q1 and Q2, and a P channel type current source MOSFET Q3 for forming or producing an operating current therefor, and a second amplifying unit comprising N channel type differential MOSFETs Q4 and Q5 and an N channel type current source MOSFET Q6 for causing an operating current therefor to flow are configured. The source of the P channel type current source MOSFET Q3 is supplied with a source or power supply voltage VDDQ, and the source of the N channel type current source MOSFET Q6 is supplied with a circuit ground potential VSS.

The gates of one differential MOSFETs Q1 and Q4 of the first amplifying unit and the second amplifying unit are respectively connected to a first input terminal IN. The gates of the other differential MOSFETs Q2 and Q5 of the first amplifying unit and the second amplifying unit are respectively connected to a second input terminal INB. These input terminals IN and INB are supplied with complementary (non-inverted and inverted) input signals. Here, the term B of INB indicates a bar (inverse) signal.

The first differential unit is provided with a first output portion comprising N channel MOSFETs Q7 through Q10, whereas the second differential unit is provided with a second output portion comprising P channel MOSFETs Q11 through Q14. The MOSFETs Q7 and Q8, and Q11 and Q12 corresponding to ones of the first and second output portions are connected in a cascode (series) configuration between the power supply voltage VDDQ and the circuit ground potential VSS, whereas the MOSFETs Q9 and Q10, and Q13 and Q14 corresponding to the others of the first and second output portions are connected in a cascode configuration between the power supply voltage VDDQ and the circuit ground potential VSS.

Drain currents of the differential MOSFETs Q1 and Q2 of the first amplifying unit flow through the MOSFETs Q8 and Q10 of the first output portion. Similarly, drain currents of the differential MOSFETs Q4 and Q5 of the second amplifying unit flow through the MOSFETs Q12 and Q14 of the second output portion. One MOSFET Q7 of the first output portion and one MOSFET Q11 of the second output portion operate, so to speak, source input and gate ground type amplifying MOSFETs. The drains thereof are respectively connected to a first output terminal. Similarly, the other MOSFET Q9 of the first output portion and one MOSFET Q13 of the second output portion operate as amplifying MOSFETs in a manner similar to the above. The drains thereof are respectively connected to a second output terminal. Of such a pair of output terminals, although not restricted in particular, a signal out at the first output terminal is transferred to an output amplifier OA and used as an internal signal of a CMOS level. A signal at the second output terminal is transmitted to the output amplifier and may be used as an internal signal of a CMOS level.

Connecting a substrate for the second and fourth differential MOSFETs to the sources enables prevention of NBT deterioration of the second and fourth differential MOSFETs.

A bias voltage VB is commonly connected to the gates of the current source MOSFETs Q3 and Q6 of the first amplifying unit and second amplifying unit, and the gates of the MOSFETs Q7 through Q14 of the first output portion and second output portion. Thus, such a configuration as to supply the bias voltage common to the gates of the current source MOSFETs Q3 and Q6 and the MOSFETs Q7 through Q14 of the first output portion and second output portion is similar to the self-bias type rail to rail circuit shown in FIG. 14.

Figure 14:
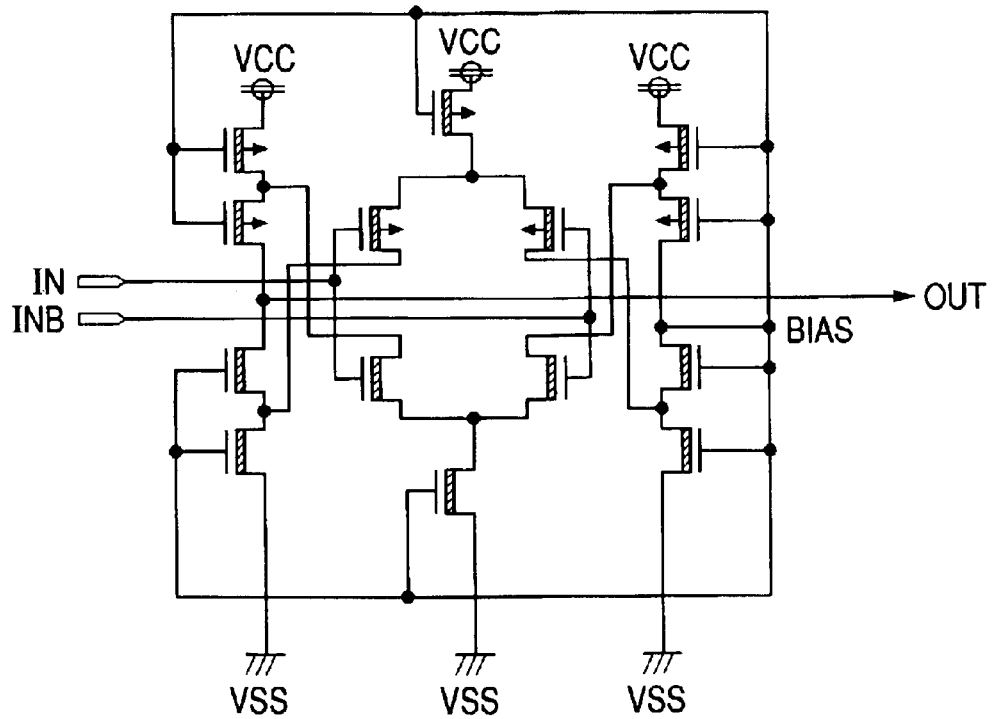
FIG. 14 is a circuit diagram of a conventional self-bias type rail to rail circuit.

The present embodiment is accompanied by a problem that in the configuration wherein the amplifier circuit per se forms the bias voltage BIAS as shown in FIG. 14, negative feedback is effected on signal changes at the input terminals IN and INB, so that the velocity or rate of change in output signal becomes slow. That is, the present embodiment is unsuited for an input circuit which accepts an input signal of low amplitude at high speed, as in the semiconductor integrated circuit device according to the invention of the present application.

In the present embodiment, the bias voltage VB is formed by a dedicated bias circuit VBG. The bias circuit VBG comprises a circuit identical to the input circuit. That is, a third amplifying unit comprising P channel type differential MOSFETs Q21 and Q22 and a P channel type current source MOSFET Q23 for forming an operating current therefor, and a fourth amplifying unit comprising N channel type differential MOSFETs Q24 and Q25, and an N channel type current source MOSFET Q26 for allowing an operating current therefor to flow are configured.

The source of the P channel type current source MOSFET Q23 is supplied with the power supply voltage VDDQ, and the source of the N channel type current source MOSFET Q6 is supplied with the circuit ground potential VSS. The gates of one differential MOSFETs Q1 and Q4 of the first amplifying unit and second amplifying unit are connected to the first input terminal IN. The gates of the other differential MOSFETs Q2 and Q5 of the first amplifying unit and second amplifying unit are connected to the second input terminal INB.

The third differential unit is provided with a third output portion comprising N channel MOSFETs Q27 through Q30, whereas the fourth differential unit is provided with a fourth output portion comprising P channel MOSFETs Q31 through Q34. The MOSFETs Q27 and Q28, and Q31 and Q32 corresponding to ones of the third and fourth output portions are connected in a cascode configuration between the power supply voltage VDDQ and the circuit ground potential VSS, whereas the MOSFETs Q29 and Q30, and Q33 and Q34 corresponding to the others of the first and second output portions are connected in a cascode configuration between the power supply voltage VDDQ and the circuit ground potential VSS.

Drain currents of the differential MOSFETs Q21 and Q22 of the third amplifying unit flow through the MOSFETs Q28 and Q30 of the third output portion. Similarly, drain currents of the differential MOSFETs Q24 and Q25 of the fourth amplifying unit flow through the MOSFETs Q32 and Q34 of the fourth output portion. The drains of one MOSFET Q27 of the third output portion and one MOSFET Q31 of the fourth output portion are connected to a third output terminal. Similarly, even in the case of the other MOSFET Q29 of the first output portion and the other MOSFET Q33 of the second output portion, their drains are connected to a fourth output terminal in a manner similar to the above. Such a pair of output terminals is connected to each other to form a bias voltage VB.

That is, the complementary output terminals are connected to each other to form an intermediate voltage between high and low levels of output signals corresponding to the input terminals IN and INB. The resultant intermediate voltage is used as the bias voltage VB and supplied to the gates of the current source MOSFETs Q23 and Q26 and the gates of the MOSFETs Q27 through Q34.

Even with respect to the bias circuit VBG, complementary input signals corresponding to the input terminals IN and INB are formed, and the output terminals for forming complementary output signals corresponding to such input signals are connected to each other, whereby a bias voltage VB supplied to the gates of the current source MOSFETs Q23 and Q26 and the MOSFETs Q27 through Q34 of the cascode unit is formed so that the complementary output signals coincide with each other. The present voltage VB is supplied to the gates of the current source MOSFETs Q3 and Q6 constituting the input circuit and the gates of the MOSFETs Q7 through Q14 of the cascode unit, whereby the input circuit forms such output signals as to be changed to high/low levels in association with the input terminals IN and INB. Of the output signals, one output signal out is amplified by the output amplifier OA such as a CMOS inverter or the like to thereby enable formation of an internal signal of a CMOS level.

Since the input circuit does not perform the negative feedback operation for forming the bias voltage VB upon a signal transfer operation for determining the level of each output signal, a signal transfer operation for forming the output signals out corresponding to the signals inputted from the input terminals IN and INB can be carried out at high speed.

Figure 2:
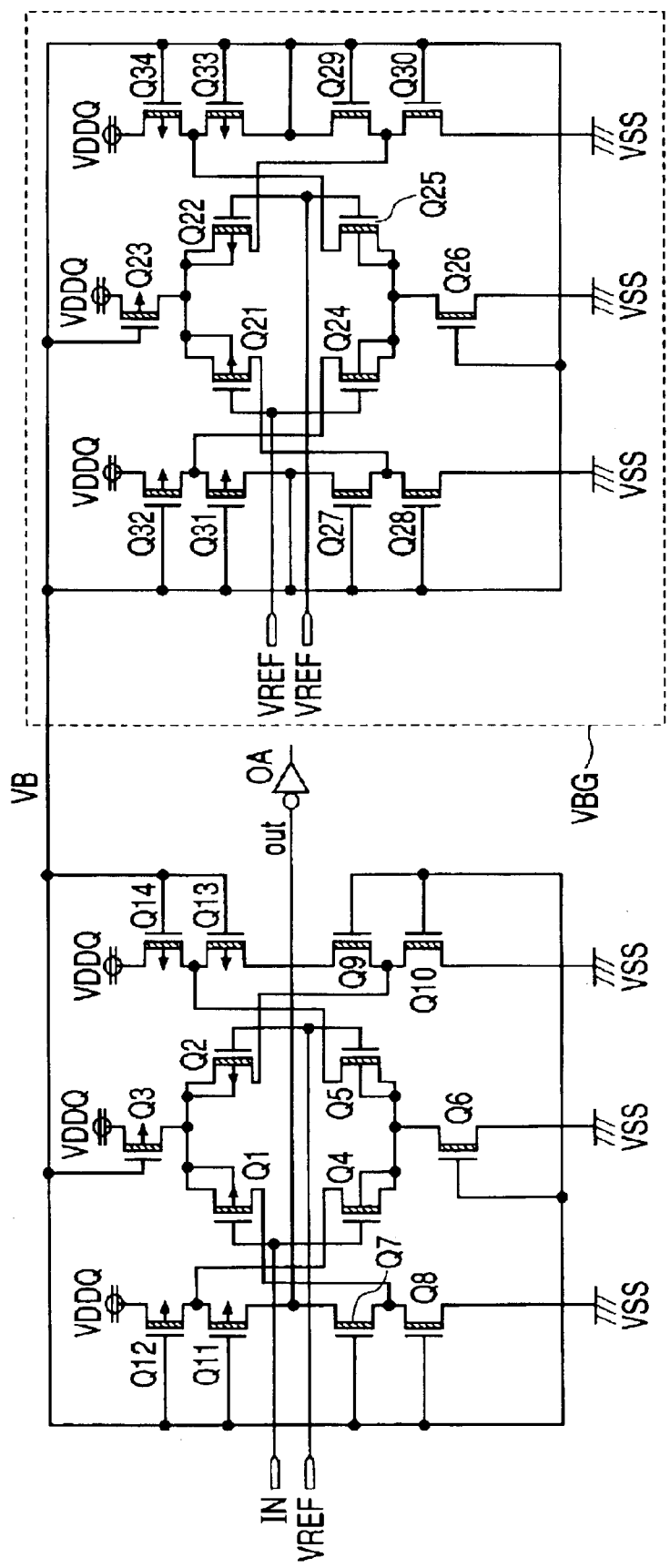
FIG. 2 is a circuit diagram illustrating another embodiment of an input circuit provided in a semiconductor integrated circuit device according to the present invention.

A circuit diagram of another embodiment of an input circuit provided in a semiconductor integrated circuit device according to the present invention is shown in FIG. 2. The input circuit according to the present embodiment makes use of the same circuit as FIG. 1. However, one input terminal IN of a pair of input terminals is supplied with an input signal. In the input circuit shown in FIG. 1, the input terminal corresponding to the input terminal INB supplied with the inverted input signal is provided as a reference voltage terminal supplied with a reference voltage VREF for determining the high level/low level of the input signal.

In a bias circuit VBG for forming a bias voltage VB supplied to the input circuit using such a reference voltage VREF, the pair of input terminals is both set as reference voltage terminals supplied with the reference voltage VREF. Since the same reference voltage VREF is supplied if no variations occur in elemental devices, a pair of output signals should be also identical to each other. In practice, however, an offset occurs in the differential paired device and even the output MOSFET has a similar offset. Therefore, such a bias voltage VB as to compensate for such offsets is formed and supplied to the corresponding MOSFETs of the input circuit. Thus, even in the case of the single-configured input circuit, the speeding up and stability of its operation can be realized.

Figure 3:
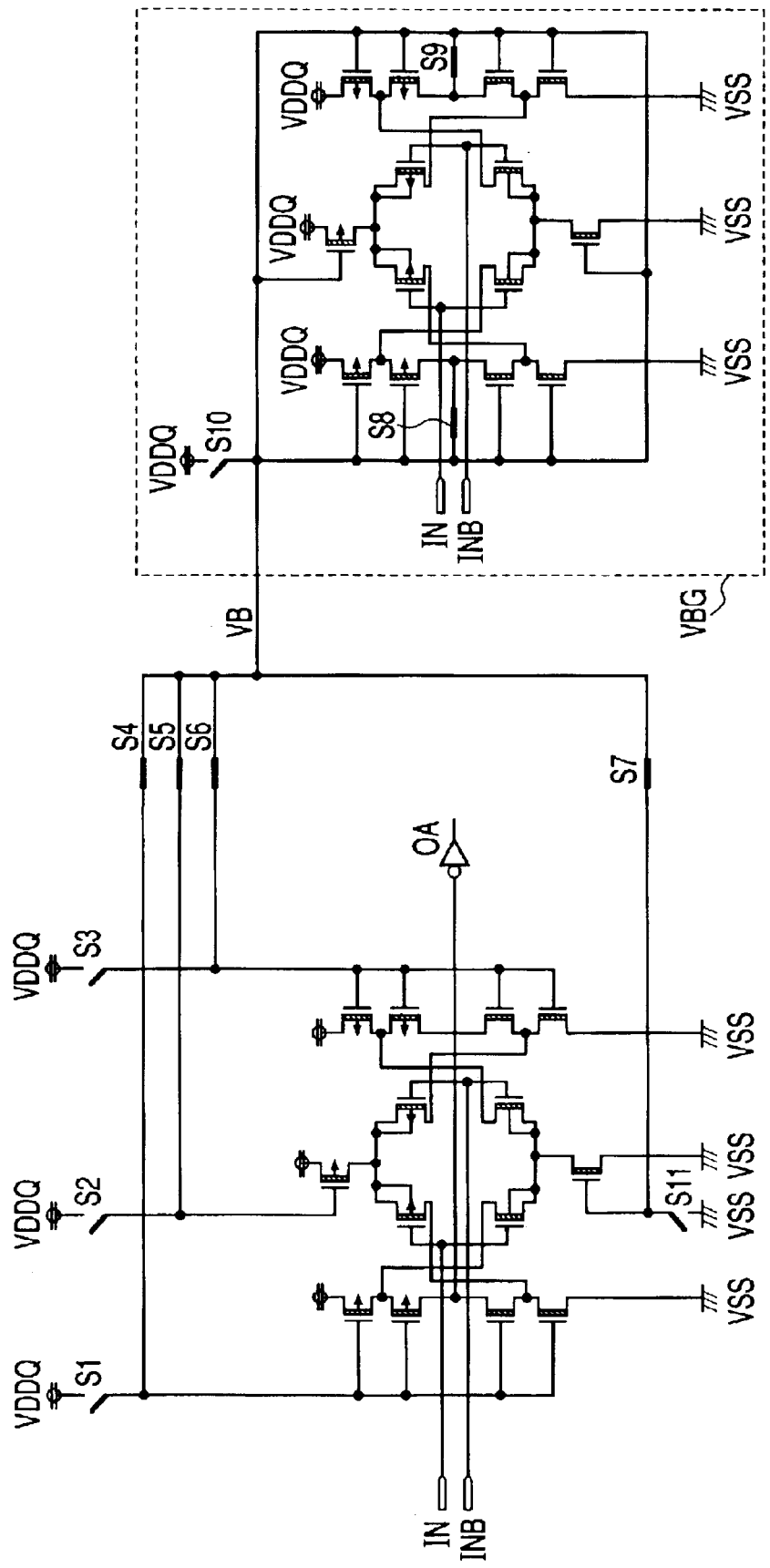
FIG. 3 is a circuit diagram depicting a further embodiment of an input circuit provided in a semiconductor integrated circuit device according to the present invention.
Figure 4:
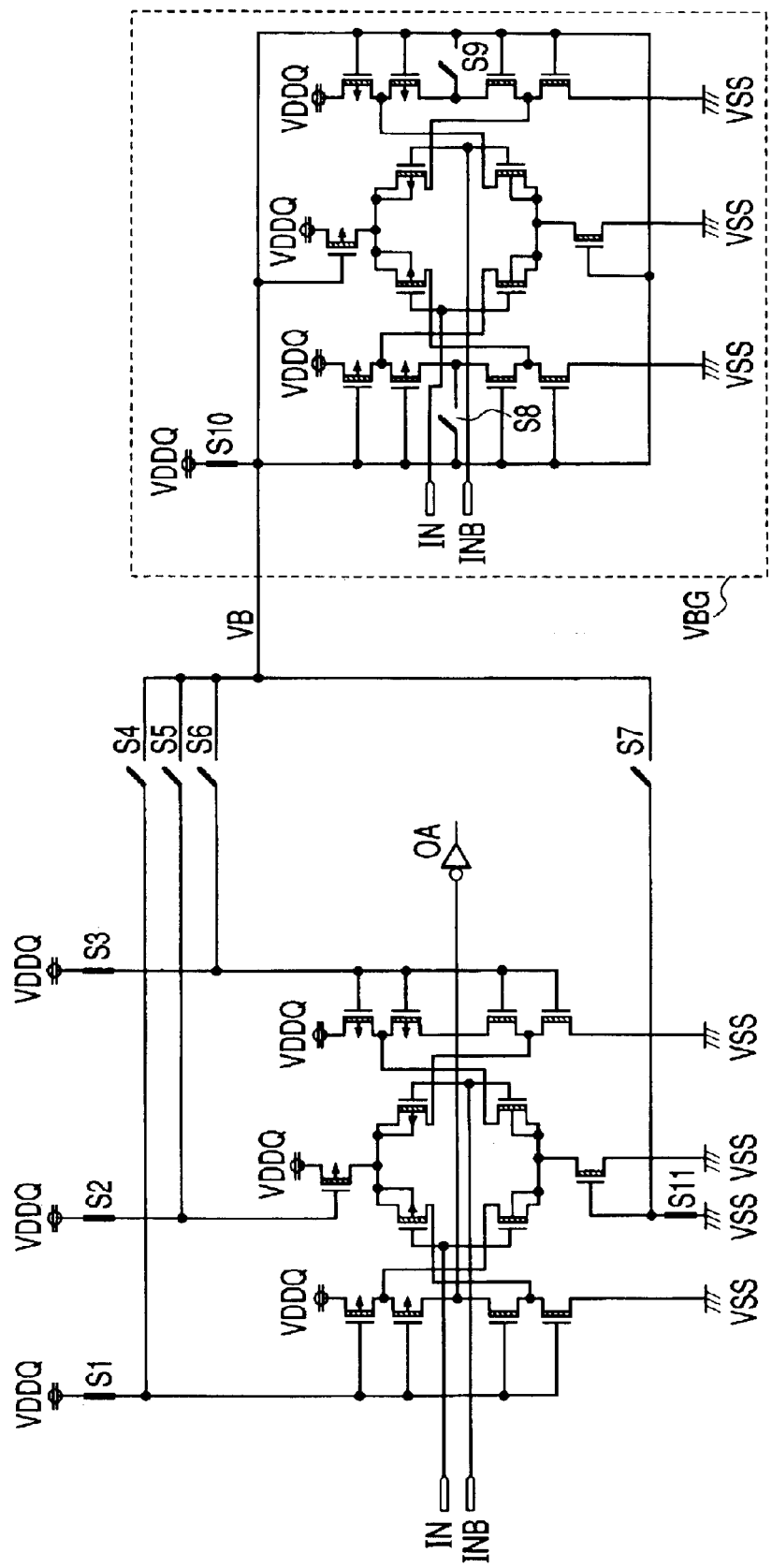
FIG. 4 is a circuit diagram showing the further embodiment of the input circuit provided in the semiconductor integrated circuit device according to the present invention.

Circuit diagrams illustrative of a further embodiment of an input circuit provided in a semiconductor integrated circuit device according to the present invention are shown in FIGS. 3 and 4. The input circuit according to the present embodiment relates to an improvement in the first embodiment of FIG. 1. The circuit according to the embodiment of FIG. 1 is additionally provided with switches S1 through S11 to thereby constitute the embodiment shown in FIGS. 3 and 4. Of these, FIG. 3 shows states of the switches S1 through S11 in a normal mode in which the semiconductor integrated circuit device performs the normal operation, and FIG. 4 shows states of the switches S1 through S11 in a standby mode in which the semiconductor integrated circuit device does not operate.

In FIGS. 3 and 4, the input circuit is divided into two cascode units, which are respectively provided with the switches S1 and S4, and S3 and S6. Further, even P channel type and N channel type current source MOSFETs are respectively provided with the switches S2 and S5, and S11 and S7. The switches S1 through S3 are provided to make selective connections to a power supply voltage VDDQ, and the switch S11 is provided to selectively connect to a circuit ground potential VSS. The switches S4 through S6 are provided to selectively transfer a bias voltage VB formed by a bias circuit VBG. Even in the bias circuit VBG, it is divided into two cascode units, which are respectively provided with the switches S8 and S9 and selectively connected to their output terminals. The switch S10 for selectively connecting to the power supply voltage VDDQ is provided for commonly-connected gates of MOSFETs of the two cascode units.

In the normal mode shown in FIG. 3, the switches S1 through S3 and S11 are respectively brought to an off state, and the switches S4 through S7 are respectively brought to an on state. Thus, the input circuit takes or assumes a connection configuration identical to the input circuit shown in FIG. 1. In the bias circuit VBG, the switches S8 and S9 are respectively brought to an on state and the switch S10 is brought to an off state. Thus, the bias circuit VBG takes a connection configuration identical to the bias circuit shown in FIG. 1. As a result, the bias circuit VBG is operated in a manner similar to the embodiment of FIG. 1 to form a bias voltage VB corresponding to each of input terminals IN and INB. The input circuit is operated in response to the bias voltage VB formed by the bias circuit to thereby form a signal out corresponding to each of input signals supplied from input terminals IN and INB.

In the standby mode of FIG. 4, the switches S1 through S3 and S11 are respectively brought to an on state and the switches S4 through S7 are respectively brought to an off state, contrary to FIG. 3. Thus, the gates of the MOSFETs of the cascode units in the input circuit are supplied with the power supply voltage VDDQ as an alternative to the bias voltage VB, so that the P channel MOSFETs are respectively brought to an off state. The P channel current source MOSFETs are respectively brought to an off state by being supplied with the power supply voltage VDDQ, whereas the N channel current source MOSFETs are respectively brought to an off state by being supplied with the circuit ground potential VSS. Accordingly, since no current path is formed between the power supply voltage VDDQ and the circuit ground potential VSS, the input circuit results in low power consumption.

Even in the case of the bias circuit VBG, the switches S8 and S9 are respectively brought to an off state and the switch S10 is brought to an on state, contrary to FIG. 3. Thus, the N channel current source MOSFETs are respectively brought to an on state by the power supply voltage VDDQ since all the P channel MOSFETs are respectively brought to an off state, and no current path is formed between the power supply voltage VDDQ and the circuit ground potential VSS even if the N channel MOSFETs of each cascode unit reach an on state. Therefore, the bias circuit VBG results in low power consumption. Since the input circuit and the bias circuit produce no dc currents in the standby mode, they result in low power consumption. However, a leak current that flows through each P channel MOSFET held in the off state, will be ignored.

As in the present embodiment, such a configuration as to supply the power supply voltage VDDQ to the respective MOSFETs of each cascode unit brings the P channel MOS- FETs into the off state in the standby mode. This is effective at preventing NBTI (Negative Bias Temperature Instability) deterioration produced where the voltage is supplied to each gate and the substrate (between channels) so as to allow the P channel MOSFETs to be turned on. Such a configuration as to connect the substrate (channels) for the differential MOSFETs and the sources thereof is profitable to the prevention of the NBTI deterioration. Therefore, the differential MOSFETs are formed in well regions electrically independent of one another, respectively.

Figure 5:
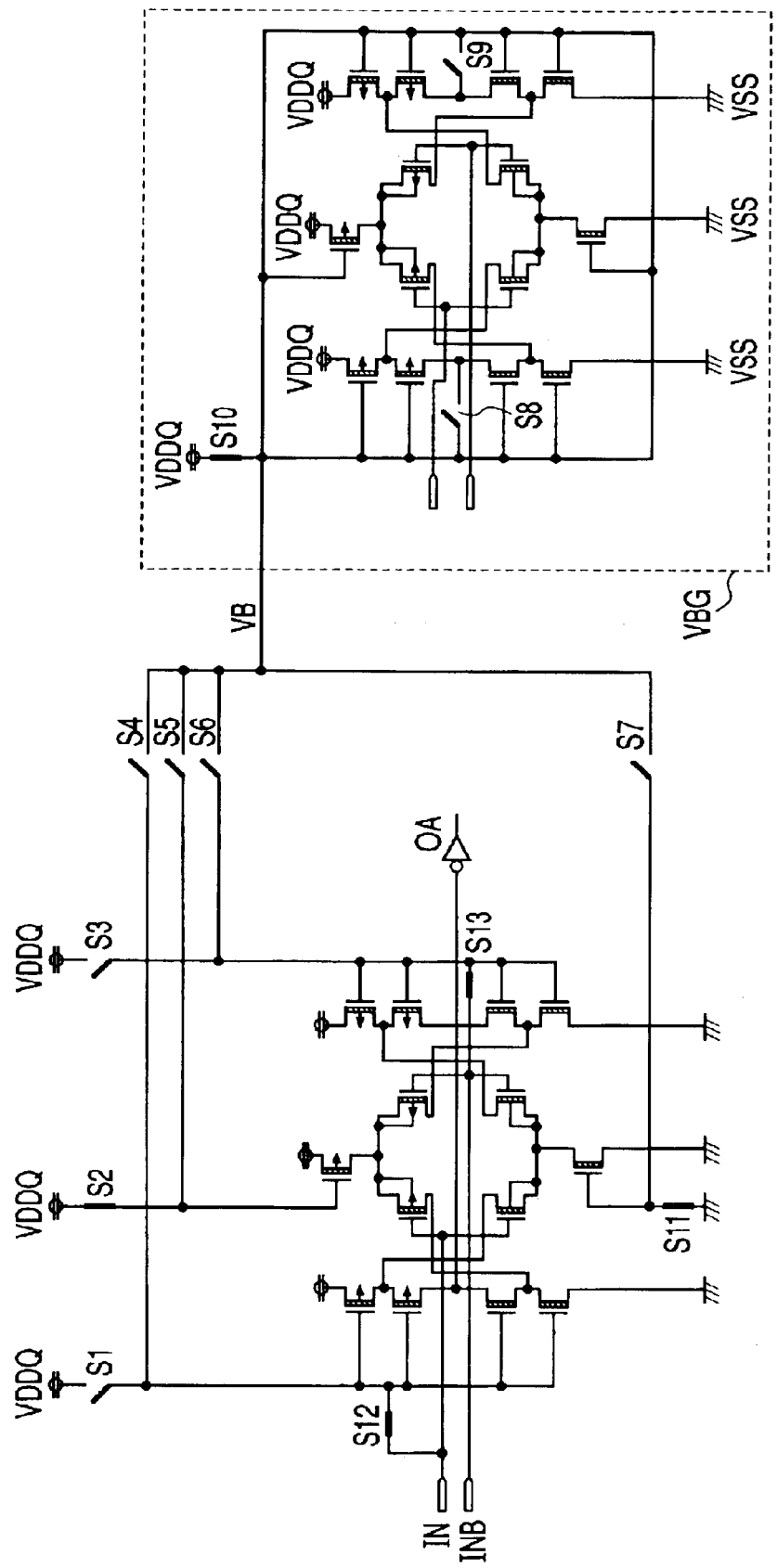
FIG. 5 is a circuit diagram illustrating a still further embodiment of an input circuit provided in a semiconductor integrated circuit device according to the present invention.

A circuit diagram illustrating a still further embodiment of an input circuit provided in a semiconductor integrated circuit device according to the present invention is shown in FIG. 5. The input circuit according to the present embodiment is added with the function of being capable of performing switching to two types of input operations of the rail to rail circuit and a CMOS circuit. In the circuit shown in FIG. 3 (FIG. 4), a switch 12 is provided between the input terminal IN and the gates of the respective MOSFETs of the cascode unit for forming the output signal. Similarly, a switch 13 is provided between the gates of the MOSFETs of the other cascode unit and their corresponding input terminal INB.

The manner of a CMOS input mode is shown in the same drawing. Switches S and S3 are brought to an off state, and switches S2 and S11 are brought to an on state. The states of other switches S4 through S10 are similar to those in the standby state of FIG. 4. A bias circuit stops operating and thereby results in low power consumption.

In the input circuit, current source MOSFETs of two differential circuits are respectively brought to an off state so that no currents flow through the differential circuits. Accordingly, an input signal supplied to the input terminal IN is supplied commonly to the gates of cascode-connected MOSFETs owing to an on state of the switch 12. In such a configuration, two P channel MOSFETs and two N channel MOSFETs are connected in series and the input signal is supplied to the gates thereof. Further, an output signal is obtained from a point where the drains of the N channel and P channel MOSFETs are connected. Therefore, the corresponding cascode unit performs an operation equivalent to a CMOS inverter circuit.

An input signal from the input terminal INB is also commonly supplied to the gates of other cascode-connected MOSFETs through the switch S13. Therefore, such cascode-connected MOSFETs also become equivalent to the CMOS inverter circuit. Hence an output signal is formed from its output terminal, and the input signal brought into an unillustrated internal circuit can be transmitted. Incidentally, when the input signal at the input terminal INB is of a signal inverted with respect to the input signal at the input terminal IN, there is no need to purposely input them by use of the two input circuits (cascode-connected MOSFETs). Any one of them may be selectively used as in, for example, the cases where the input terminal INB is used in the case of a bar signal and the input terminal IN is used in the case of a true signal.

The switches S1 through S13 are made up of, for example, MOSFETs. When the input voltage cannot be outputted as it is due to threshold voltages of the MOSFETs, the P channel MOSFETs and N channel MOSFETs are connected in parallel and such CMOS switches as to turn on/off them according to control signals may be used.

Figure 6:
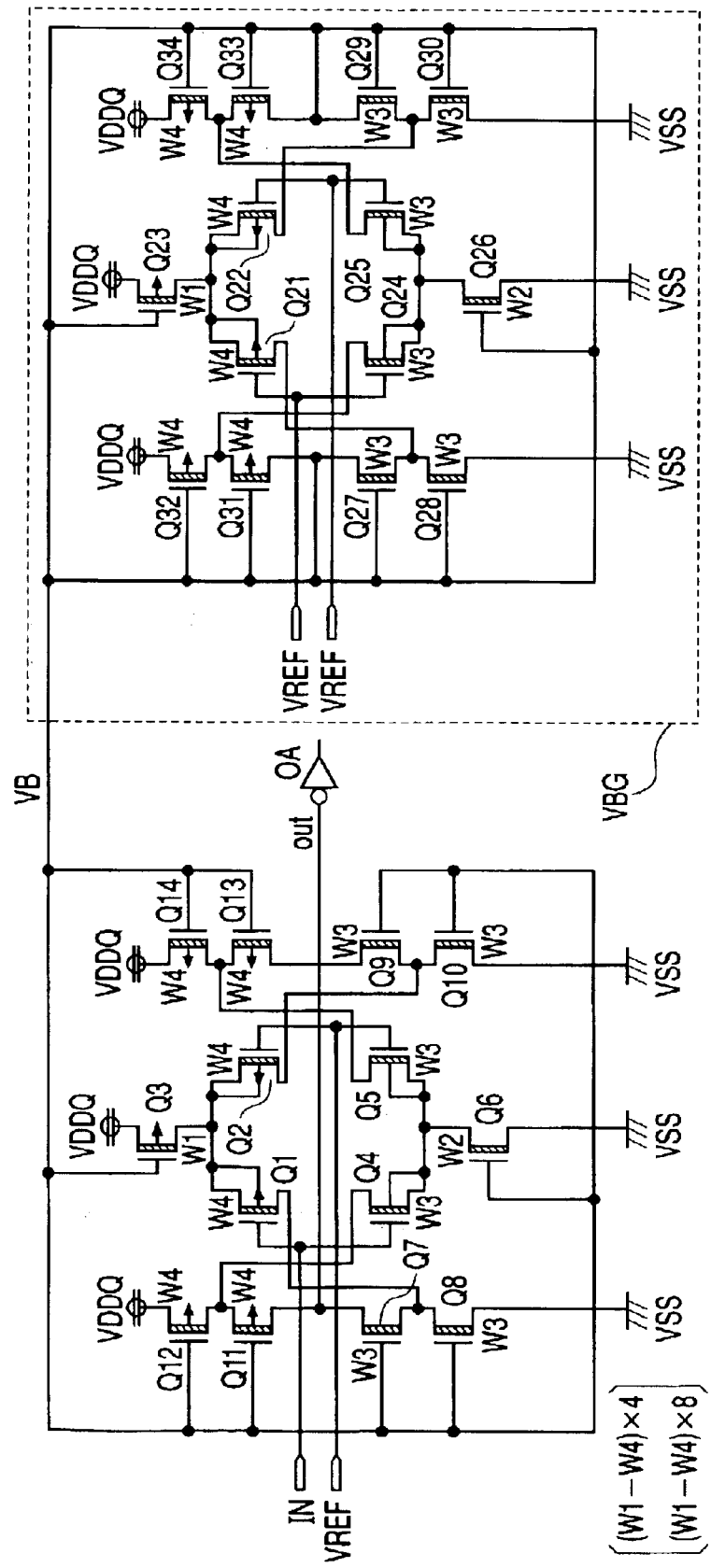
FIG. 6 is a circuit diagram showing a still further embodiment of an input circuit provided in a semiconductor integrated circuit device according to the present invention.

A circuit diagram showing a still further embodiment of an input circuit provided in a semiconductor integrated circuit device according to the present invention is shown in FIG. 6. The present embodiment is basically identical to the second embodiment. In the present embodiment, P channel differential MOSFETs Q1 and Q2 in the input circuit and P channel MOSFETs Q11 through Q14 in a cascode unit respectively have channel widths formed so as to be identical to one another like W4. N channel differential MOSFETs Q4 and Q5 in the input circuit and P channel MOSFETs Q7 through Q10 in a cascode unit respectively have channel widths formed so as to be identical to one another like W3.

A P channel MOSFET Q3 for forming an operating current for the P channel differential MOSFETs Q1 and Q2 has a channel width formed like W3 so as to be smaller than the channel widths W4 of the other MOSFETs Q1 and Q2 of the same P channels. In other words, an on resistance value thereof is formed so as to become large. Similarly, a P channel MOSFET Q6 for forming an operating current for the N channel differential MOSFETs Q4 and Q5 has a channel width formed like W2 so as to be smaller than the channel widths W3 of the other MOSFETs Q4 and Q5 and the like of the same N channels. In other words, an on resistance value thereof is formed so as to become large. Even in a bias circuit VBG, MOSFETs Q21 through Q34 respectively have channel widths formed like W1 through W4 in the same manner as the MOSFETs Q1 through Q14 of the corresponding input circuit.

The reason why the on resistance values of the current source MOSFETs Q3 (Q23) and Q6 (Q26) are made large in a differential amplifying unit, is to reduce changes in potentials at the drains of their corresponding differential MOSFETs Q1 and Q2 (Q21 and Q22). That is, in the N channel differential MOSFETs Q4 and Q5, drops of their drain potentials to the low-voltage side are restricted, whereas in the P channel differential MOSFETs Q1 and Q2, rises in their drain potentials are restricted.

Reducing variations in drain potentials in such a differential amplifying unit allows speeding up of signal switching. That is, when differential MOSFETs and a current source MOSFET for forming an operating current therefor are made identical in size, their on resistance values become similar, and drops or rises in potentials at the drains of MOSFETs brought to an on state will increase relatively with respect to a differential input. When the voltage at the drain of the MOSFET Q4 drops greatly where, for example, the differential MOSFET Q4 is in an on state and the MOSFET Q5 is in an off state, the input signal changes, and the drop in the drain voltage can be recovered only by the current source MOSFET Q12 of the cascode unit upon switching to the output level. Since the MOSFET Q12 supplies a current even to the amplifying MOSFET Q11 of the cascode unit, it will take time to recover the drop in the drain voltage.

That is, even as the differential MOSFET Q4 is switched from the on state to the off state, the current of the MOSFET Q12 is supplied to the amplifying MOSFET Q11, and the operation of forming the inverted signal at the on-state of the differential MOSFET Q4 must be performed, the current is used even for charging parasitic capacity of the drain of the MOSFET Q4, thus slowing output switching.

On the other hand, the simple configuration that the on resistance value of the current source MOSFET Q3 (Q6) is made large as compared with the differential MOSFETs Q1 and Q2 (Q4 and Q5) as in the invention of the present application, makes it possible to reduce widths of changes in the drain voltages of the differential MOSFETs Q1 and Q2 (Q4 and Q5), whereby the foregoing output switching can be performed at high speed. That is, the transmission rate of the input signal can be rendered high.

When the case in which the sizes of the corresponding MOSFETs are made equal to one another as in the case of W1 through W4, is taken as the reference, and the sizes of the respective MOSFETs on the input circuit side are respectively set to four times as in the case of (W1 through W4)×4 in the input circuit and bias circuit as in the present embodiment, the currents flowing through the respective MOSFETs reach four times, so that a signal transmission rate can be speeded up. In this case, a large current flows on the input circuit side and the bias circuit may be reduced in current. Therefore, the current in a normal mode can be used efficiently.

When the case in which the sizes of the corresponding MOSFETs are made equal to one another as in the case of W1 through W4, is taken as the reference, and the sizes of the respective MOSFETs on the input circuit side are respectively set to eight times as in the case of (W1 through W4)×8 in the input circuit and bias circuit, the currents flowing through the respective MOSFETs reach eight times, so that a signal transmission rate can be further speeded up. In this case, a large current flows on the input circuit side and the bias circuit may be reduced in current. Therefore, the current in a normal mode can be used efficiently.

In a synchronous SRAM to be described later, for example, the MOSFETs like the above (W1 through W4) ×8 are used for an input circuit inputted with clock signals CLK and CLKB, the MOSFETs like the above (W1 through W4)×4 are used for control signals S, WE, WEx, etc., and address signals A0 through A18·AS and DQ0 through DA35 are used so as to take magnification equal to the bias circuit VBG, like (W1 through W4)×1. That is, they can be used properly as three stages corresponding to required transmission rates of their input signals.

Figure 7:
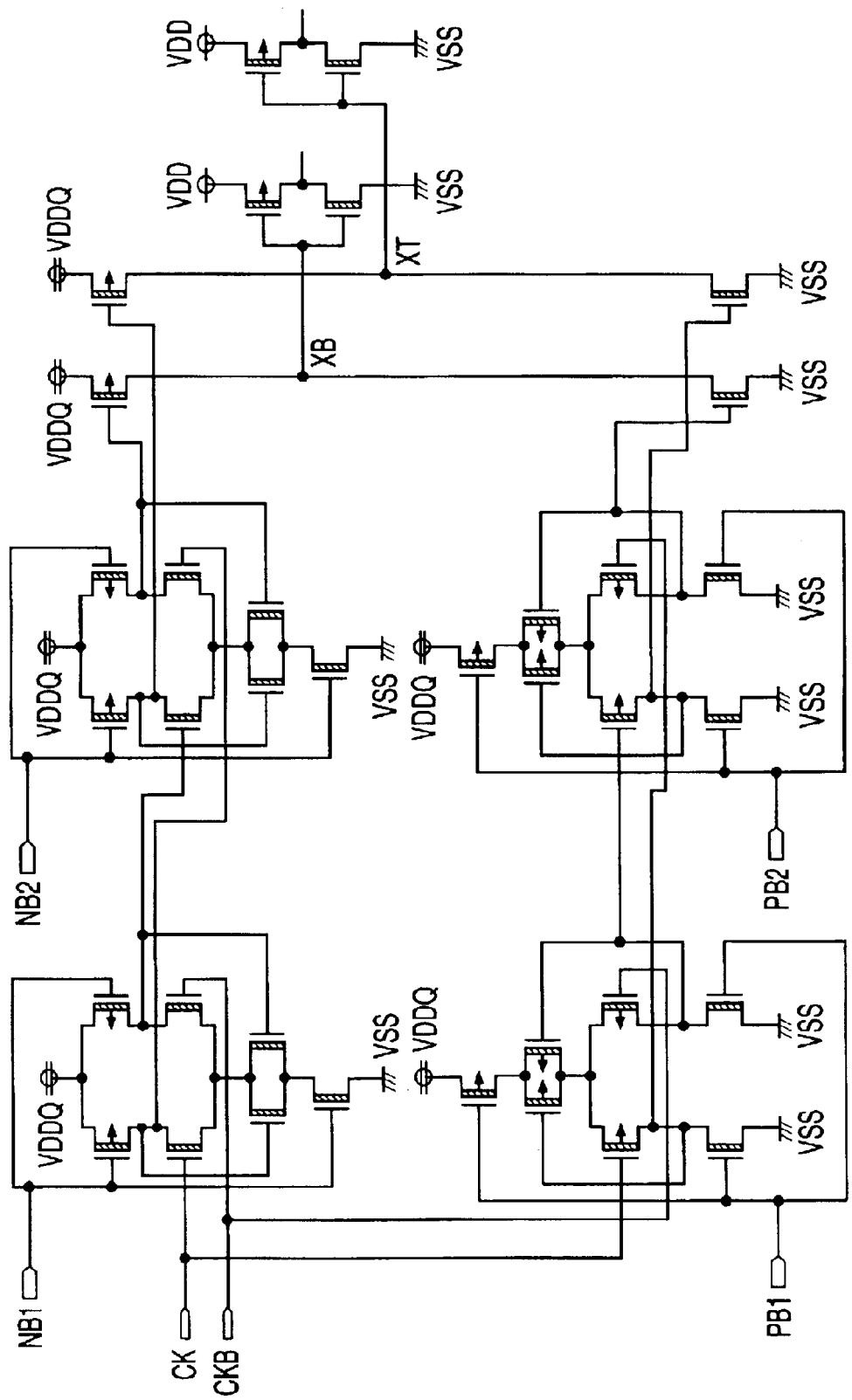
FIG. 7 is a circuit diagram depicting a still further embodiment of an input circuit provided in a semiconductor integrated circuit device according to the present invention.

A circuit diagram showing a still further embodiment of an input circuit provided in a semiconductor integrated circuit device according to the present invention is shown in FIG. 7. The present embodiment is not intended for the above-described rail to rail circuit. A first difference amplifier circuit is made up of N channel differential MOSFETs, N channel current source MOSFETs and P channel load MOSFETs. Similarly, a second differential amplifier circuit is made up of P channel differential MOSFETs, P channel current source MOSFETs and N channel load MOSFETs. Input terminals of the first and second differential amplifier circuits are made common and connected to input terminals CK and CKB.

Although not restricted in particular, two MOSFETs whose gates are respectively supplied with drain outputs of differential MOSFETs and which are connected in a parallel configuration, are provided between a current source MOSFET and common sources of the differential MOSFETs. These MOSFETs are provided to perform such a feedback operation as to reduce a variation in output signal.

Similar third and fourth differential amplifier circuits are respectively provided with respect to the first and second differential amplifier circuits. The first and third differential amplifier circuits having N channel differential MOSFETs are connected in a cascade configuration, and the second and fourth differential amplifier circuits having P channel differential MOSFETs are connected in a cascade configuration. These are respectively configured so as to perform two-stage amplifying operations.

A signal outputted from the third amplifier circuit is supplied to the gate of its corresponding P channel output MOSFET, and a signal outputted from the fourth amplifying circuit is supplied to the gate of its corresponding N channel output MOSFET. Further, the corresponding ones for the complementary amplified signals of the P channel and N channel output MOSFETs are connected to each other in a series configuration to form an inverted output signal XB and a non-inverted output signal XT. These output signals XB and XT are brought to an internal circuit as complementary signals through CMOS inverter circuits.

In each of the first through fourth amplifier circuits, a bias voltage supplied to the gate of the current source MOSFET and a bias voltage supplied to the gate of the load MOSFET of conductivity type opposite thereto are made identical. These bias voltages are formed by such a bias circuit as to be next described.

Figure 8:
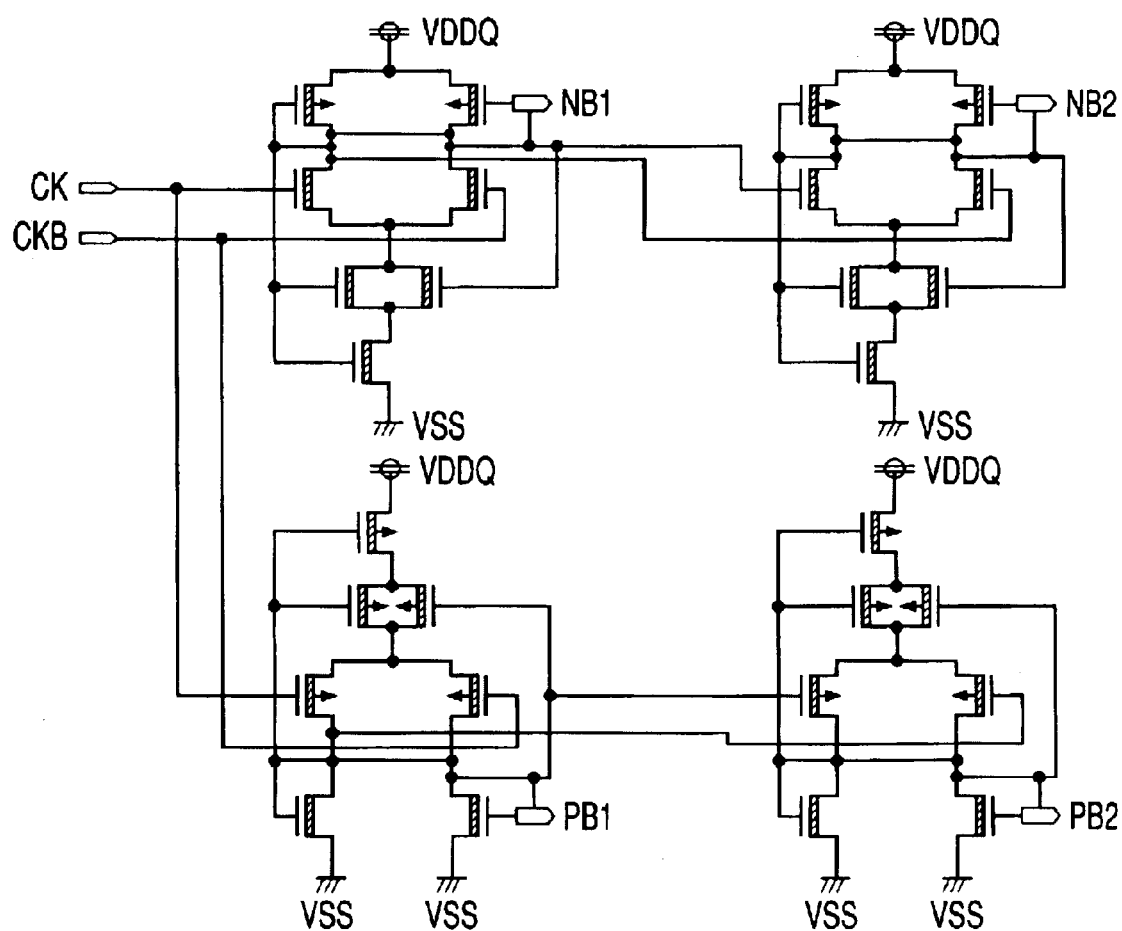
FIG. 8 is a circuit diagram showing one embodiment of a bias circuit employed in the input circuit shown in FIG. 7.

A circuit diagram showing one embodiment of a bias circuit employed in the input circuit shown in FIG. 7 is shown in FIG. 8. The bias circuit forms or produces four types of bias voltages NB1, PB1, NB2 and PB2 supplied to the current source MOSFETs and load MOSFETs of the first through fourth amplifier circuits shown in FIG. 7.

The bias circuit makes use of one having a circuit configuration identical to the input circuit in a manner similar to the bias circuit provided in the rail to rail circuit. That is, four differential amplifier circuits identical in circuit configuration to the first through fourth differential amplifier circuits of the input circuit shown in FIG. 7 are used. The pre-stage two differential amplifier circuits are respectively connected to input terminals CK and CKB in a manner similar to the input circuit. They are similar to the input circuit up to the connections of differential outputs of the pre-stage differential amplifier circuits to input terminals of the subsequent-stage differential amplifier circuits.

In the four differential amplifier circuits constituting the bias circuit, drain outputs of their differential MOSFETs are commonly connected. The four differential amplifier circuits respectively form four types of bias voltages NB1, NB2, PB1 and PB2 while controlling their own load MOSFETs and current source MOSFETs such that their complementary output terminals are connected to one another so as to make equal voltages. Thus, the speeding up and stability of the operation of the input circuit capable of responding to input signals varied within ranges of a power supply voltage and a circuit ground potential can be realized.

Figure 9A:
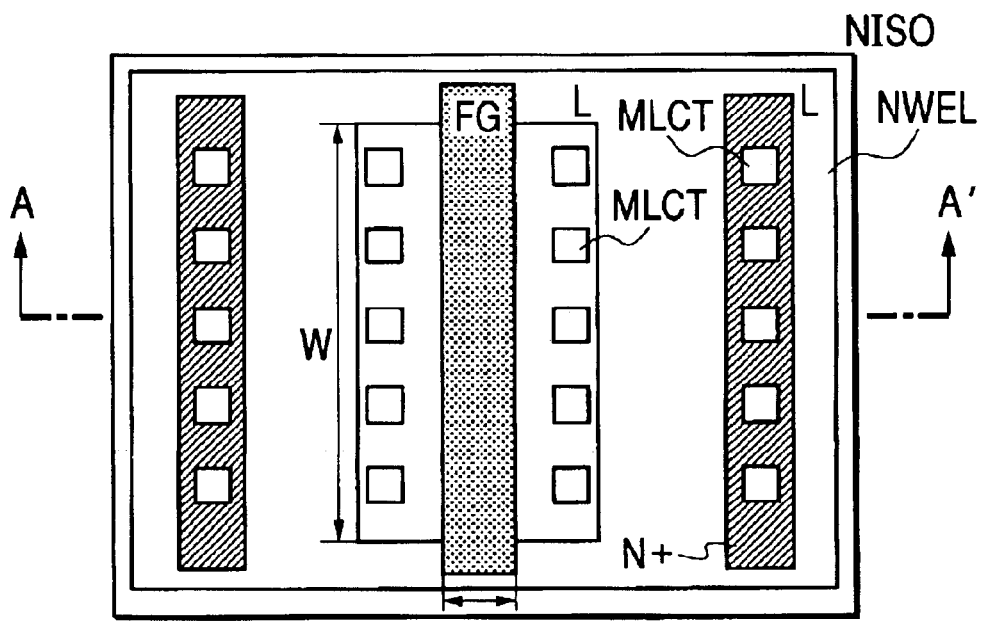
FIGS. 9(A) and 9(B) are device structural diagrams illustrating one embodiment of a P channel MOSFET employed in the present invention.
Figure 9B:
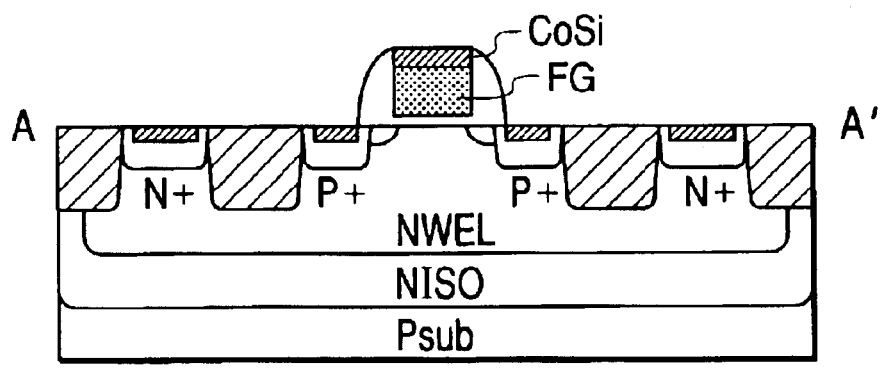

A device structural diagram illustrating one embodiment of a P channel MOSFET employed in the present invention is shown in FIGS. 9(A) and 9(B). A plan structure thereof is shown in FIG. 9(A) and a sectional structure thereof is shown in FIG. 9(B), respectively. A P channel MOSFET is formed with P+ type semiconductor regions L constituting a source and drain so as to interpose therebetween a gate electrode FG formed over a substrate with a thin gate insulating film interposed therebetween in an N type well NWEL. The N well NWEL is provided with N+ semiconductor regions to supply a well bias voltage. Here, the gate width W shown in FIG. 6 corresponds to the length of a source-drain diffusion layer extending in a direction in which the gate, source and drain are arranged in parallel. Further, a gate length Lg is a length under which a channel current flows, and corresponds to a spacing between the source and drain.

Figure 10A:
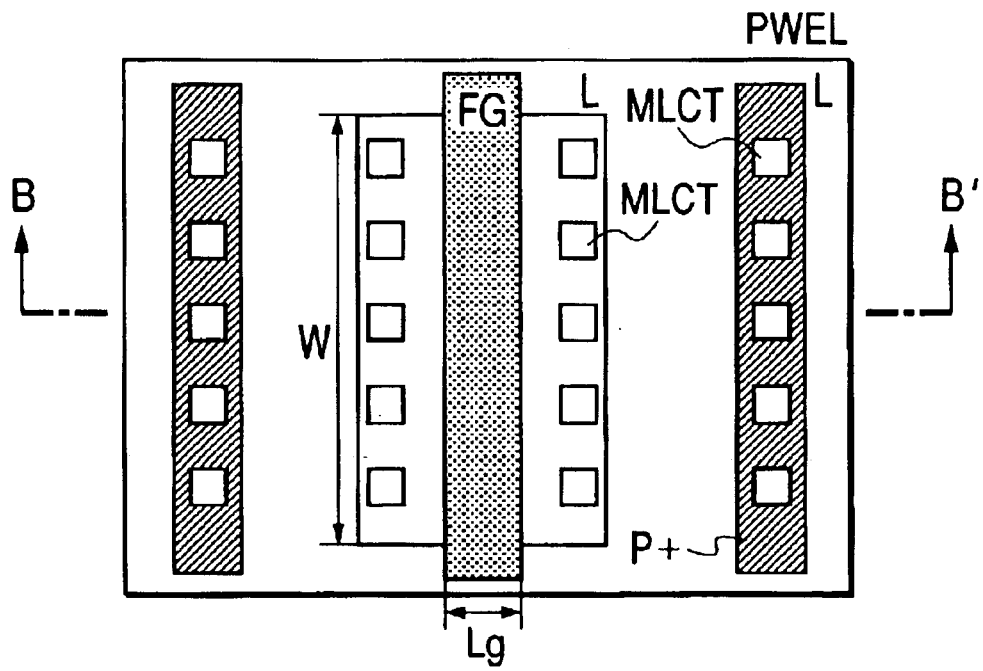
FIGS. 10(A) and 10(B) are device structural diagrams depicting one embodiment of an N channel MOSFET employed in the present invention.
Figure 10B:
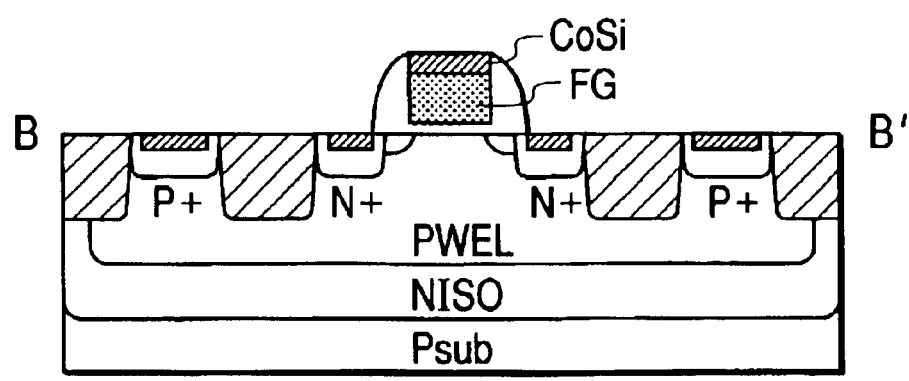

A device structural diagram depicting one embodiment of an N channel MOSFET employed in the present invention is shown in FIGS. 10(A) and 10(B). A plan structure thereof is shown in FIG. 10(A) and a sectional structure thereof is shown in FIG. 10(B), respectively. An N channel MOSFET is formed with N+ type semiconductor regions L constituting a source and drain so as to interpose therebetween a gate electrode FG formed with a thin gate insulating film interposed therebetween in a P type well PWEL. The P well PWEL is provided with P+ semiconductor regions to supply a well bias voltage. A gate width W and a gate length Lg are similar to FIGS. 9(A) and 9(B).

Figure 11:
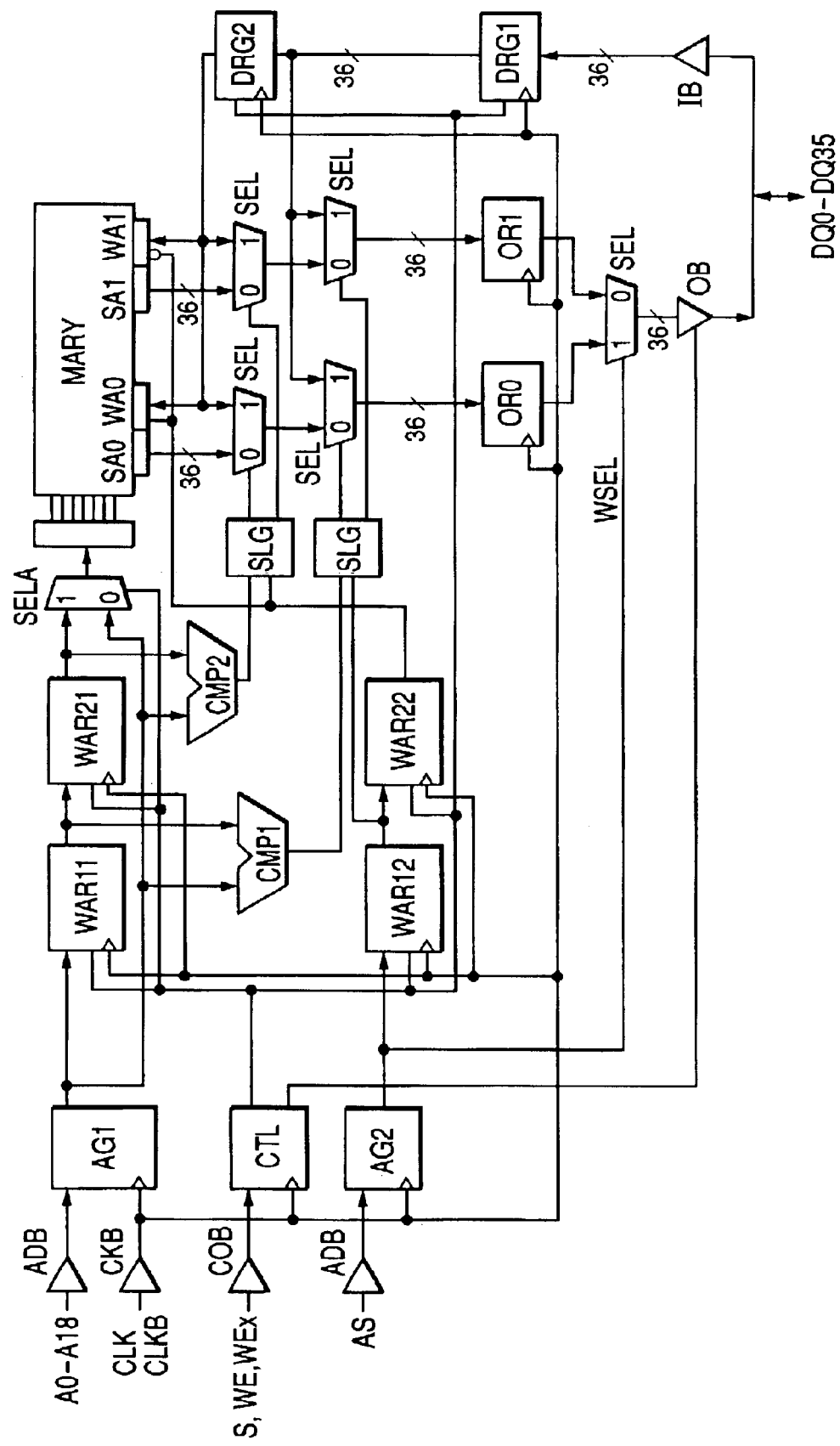
FIG. 11 is a block diagram showing one embodiment of an SSRAM to which the present invention is applied.

A block diagram showing one embodiment of a synchronous SRAM (hereinafter called simply "SSRAM") to which the present invention is applied, is shown in FIG. 11. The synchronous SRAM according to the present embodiment is formed on a single semiconductor substrate like monocrystal silicon by the known CMOS integrated circuit manufacturing technology.

The SSRAM according to the present embodiment has an address space of about 1M (mega) by 20 bits comprising address terminals A0 through A18 and a weigh select address AS. Since reading and writing are performed in parallel by 36 bits through data terminals DQ0 through DQ35, a memory array MARY is set so as to have a memory capacity of about 36M bits. The memory array MARY is configured such that static type memory cells are placed at intersecting points of word lines and complementary bit lines in a matrix form.

Address signals inputted to the address terminals A0 through A18 are brought into an address register AG1 through an address buffer ADB. Non-inverted and inverted complementary clock signals CLK and CLKB are brought through a clock buffer CKB. Control signals S, WE and WEx for read/write control are taken in through a control buffer COB. Further, the select signal AS is also brought into an address register AG2 through an address buffer ADB. An input buffer IB is provided in association with write data from the data terminals DQ0 through DQ35.

Accordingly, the input circuit according to the above embodiment is applied to these various input circuits. In the embodiment of FIG. 6 in particular, the address buffer ADB and data input buffer IB make use of the circuits according to the embodiment of FIG. 6. As one for the control buffer COB, an input circuit is constructed of MOSFETs whose gate widths W are set to four times with respect to the corresponding MOSFETs of the bias circuit. Further, as the clock buffer CKB requiring the maximum speed, an input circuit is constructed of MOSFETs whose gate widths W are set to eight times with respect to the bias circuit.

Upon a read operation, the address register AG1 transfers the corresponding signal to a decoder of the memory array MARY through a selector SELA. Upon a write operation, the corresponding address is time-adjusted by write address registers WAR11 and WAR21, followed by transfer to the decoder through the selector. Similarly, the weigh select address AS is also time-adjusted by similar registers WAR12 and WAR22. Since the write address and write data corresponding to it are shifted by one cycle upon the write operation, an adjustment to its shift is performed by the write address registers.

In the memory array MARY, although not restricted in particular, data corresponding to 36×2=72 bits are read by a weigh 0 (SA0) and a weigh 1 (SA1) according to the address signals A0 through A18. Write data is transferred to write amplifiers WA0 and WA1 of the memory array MARY through data registers DRG1 and DRG2. The read data of the sense amplifiers SA0 and SA1 and the write data of the data register DRG2 are selected by their corresponding selectors. Further, the outputs of the selectors and the write data of the data register DRG1 are respectively transmitted to output registers OR0 and OR1 selected by their corresponding selectors.

Signals for selecting the selectors are formed by select control circuits SLG respectively. Of the data transferred to the two output registers OR0 and OR1, one thereof is selected by a weigh select signal WSEL corresponding to the weigh address AS and outputted through an output buffer OB. The select control circuits SLG refer to signals sent from comparators CMP1 and CMP2 for comparing the write addresses of the write address registers WAR11 and WAR21 and their corresponding input addresses, and the weigh select addresses of the write address registers WAR12 and WAR22 to thereby form the select signals.

Figure 12:
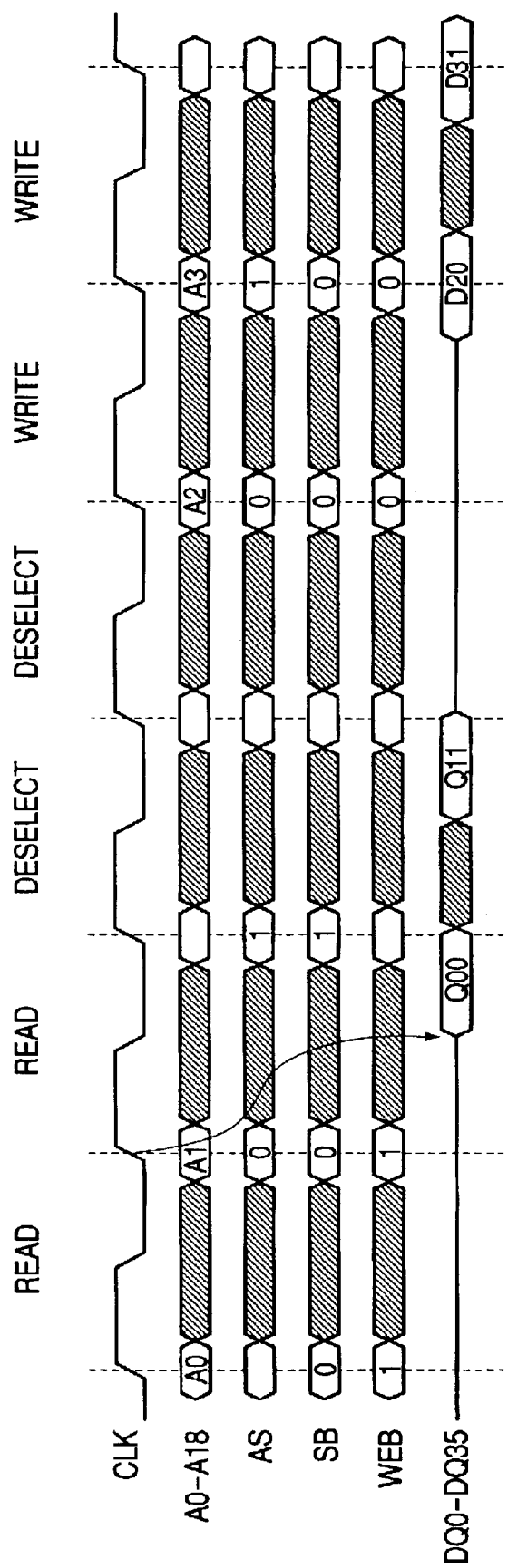
FIG. 12 is a timing chart for describing one example of the operation of the SSRAM shown in FIG. 11.

A timing chart for describing one example of the operation of the SSRAM shown in FIG. 11 is shown in FIG. 12. A low level (logical 0) of a select signal SB and a high level (logical 1) of a write enable signal WEB define a read cycle. In the read cycle, the address A0 is brought from the address signals A0 through A18 so that the data corresponding to the two weighs are read. Similarly, a read cycle is defined in a second cycle. In the read cycle, the address A1 is brought from the address signals A0 through A18 so that the operation of selecting memory cells corresponding to the two weighs is performed. When a low level (logical 0) of the weigh address AS is inputted with a delay of once cycle and thereby the weigh 0 is designated or specified, data Q00 corresponding to the weigh 0, which has been brought in its corresponding data register DR0, is outputted. When a high level (logical 1) of the select signal SB is taken in a third cycle, this cycle is defined as a non-selected cycle. At this time, however, a high level (logical 1) of the weigh address AS is inputted and data Q11 corresponding to the weigh 1, which has been read in association with the address A1, is outputted.

In a fifth cycle, the low level (logical 0) of the select signal SB and a low level (logical 0) of the write enable signal WEB define a write cycle. In this case, the address A2 is brought from the address signal A0 through A18 and the low level (logical 0) of its corresponding weigh address AS is taken. Similarly, a write cycle is defined in a sixth cycle, and the address A3 from the address signals A0 through A18 and the high level (logical 1) of its corresponding weigh address As are taken, so that write data D20 corresponding to the address A2 and 0 of the weigh address is inputted. The read cycle can be inserted even during the write cycle, and address registers, write data registers, comparators, etc. are used for its adjustments.

In such an SSRAM, each memory cell or the like is formed with a gate length Lg of each MOSFET according to the minimum processing size. When MOSFETs constituting each memory cell are formed according to a processing size of a 0.12 μm process, for example, the sizes of the MOSFETs of the input circuit (bias circuit) are formed so as to be larger than that. This is because when each MOSFET is formed with the above minimum processing size, an influence produced due to variations in the gate length Lg is significant and the range of a change in threshold voltage also increases.

Referring to FIG. 1, for example, the differential MOSFETs Q1 and Q2 (Q4 and Q6), current source MOSFET Q3 (Q6) and load MOSFETs Q8 and Q10 (Q12 and Q14) are respectively formed on a large scale such that their gate lengths Lg reach 0.25 μm equal to about twice the minimum processing size. Of the MOSFETs of each cascode unit, the MOSFETs Q8 and Q10 (Q12 and Q14) used as the loads (current source) are formed on a large scale as described above, whereas the amplifying MOSFETs Q7 and Q9 (Q11 and Q13) respectively have gate lengths Lg formed small like 0.16 μm.

Reducing the gate lengths Lg of the MOSFETs Q7 and Q9 (Q11 and Q13) makes it possible to reduce their gate capacities, i.e., capacities between their gate electrodes and channels. Thus, parasitic capacity of an output signal path of each cascode unit becomes small and a change in the output signal voltage out formed by charge and discharge of each parasitic capacity can be speeded up.

While the channel lengths Lg of the differential MOSFETs and current source MOSFETs are formed equally in the differential amplifier circuit as described above, the gate widths W4 (W3) of the differential MOSFETs Q1 and Q2 (Q4 and Q5) are formed small like the gate width W1 (W2) of the current source MOSFET Q3 (Q6) as in the embodiment of FIG. 6. Thus, the range of a change in the drain voltage of each different MOSFET can be reduced as described above and switching to each transfer signal can be performed at high speed.

When the operation power supply voltage VDDQ is made operable up to a low voltage like 1.2V in the SSRAM for example, the MOSFETs of the input circuit and bias circuit are respectively formed so as to take a low threshold voltage like 0.4V. Such a low threshold voltage is set by control of the introduction of an impurity of conductivity type opposite to the well into the surface of the semiconductor substrate below the gate electrode FG by an ion implantation technology or the like in the device structures shown in FIGS. 9(A) and 9(B) and FIGS. 10(A) and 10(B).

Figure 13:
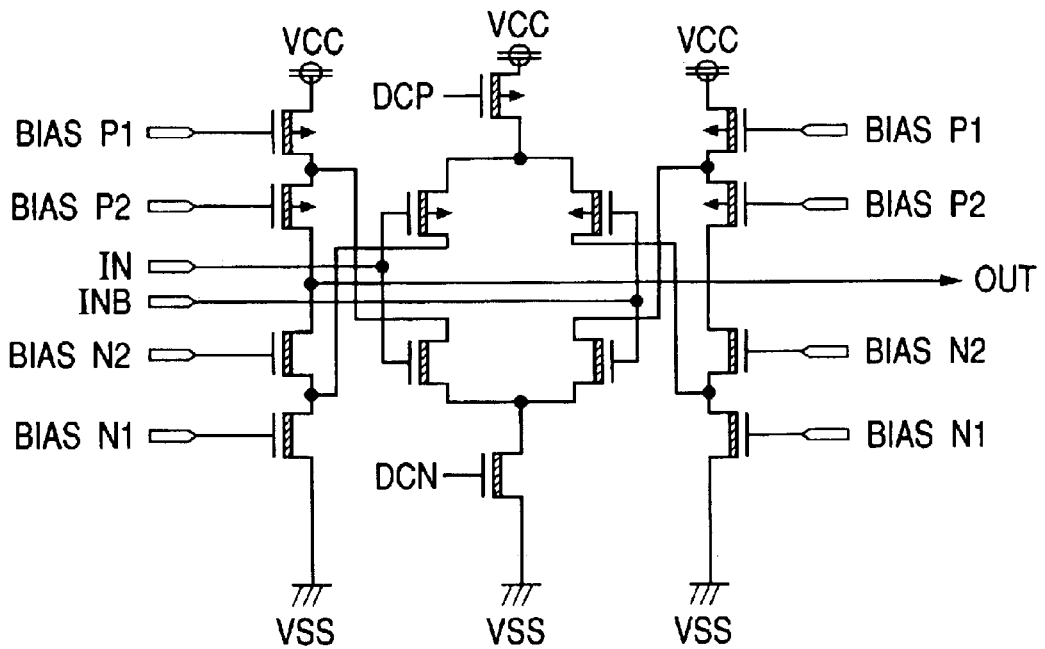
FIG. 13 is a circuit diagram of a rail to rail circuit discussed prior to the present invention.

Applying the settings of the gate lengths Lg and gate widths W corresponding to the sizes of the above MOSFETs even to the rail to rail circuits shown in FIGS. 13 and 14 as well as to the rail to rail circuit employed in the above embodiment makes it possible to achieve speeding up and stability of operation.

In a logic circuit or the like which receives therein an input signal of a CMOS level in the SSRAM, its threshold voltage is set to a high threshold voltage, e.g., about 0.6V, larger than ones of the MOSFETs of the input circuit and bias circuit in order to reduce a leak current or a threshold leak current in an off state of each MOSFET. Thus, when the MOSFETs having the two types of threshold voltages are formed in the semiconductor integrated circuit device, this is set by control on the impurity on the semiconductor substrate surface below the gate electrode FG by the ion implantation technology or the like.

While the invention made above by the present inventors has been described specifically based on the illustrated embodiments, the invention of the present application is not limited to the embodiments. It is needless to say that various changes can be made thereto within the scope not departing from the substance thereof. In the embodiment of FIG. 2, for example, such a configuration that one input circuit is made typical to operate a bias circuit and a bias voltage formed thereby is supplied to a plurality of input circuits, may be taken in addition to the provision of the bias circuits for the respective input circuits respectively. Such a configuration that the bias circuits are provided in a one-to-one correspondence with the individual input circuits, yields a large circuit scale while it can form the optimum bias voltage corresponding to each of the input signals supplied thereto. On the other hand, since such a reference voltage VREF as shown in FIG. 2 is common to all the input circuits, such a configuration that one bias circuit is made typical to supply a bias voltage to a plurality of input circuits, can be simplified in circuit.

The present invention becomes profitable to a semiconductor integrated circuit device wherein the frequency of an input signal exceeds about 1 GHz and an internal circuit takes a CMOS configuration. When the frequency of the input signal exceeds about 1 GHz, there are tendencies to reduce the amplitude of the input signal due to capacity reflection, decrease a data effective time interval too and cause a shift in the center of an input potential. Therefore, the input circuit according to each embodiment referred to above is suitable as such an input circuit that receives the input signal therein. Alternatively, the present invention is suitable for application to various semiconductor integrated circuit devices wherein the amplitude of input signals are smaller than CMOS amplitude, and internal circuits are respectively made up of CMOS circuits.

Advantageous effects obtained by a typical one of the inventions disclosed in the present application will be described in brief as follows: A first differential MOSFET pair of first conductivity type whose gates are respectively connected to a pair of first input terminals, and a first current source MOSFET of first conductivity type which is provided at common sources of the first differential MOSFET pair and forms an operating current, constitute a first amplifying unit. A second differential MOSFET pair of second conductivity type whose gates are respectively connected to the pair of first input terminals and a second current source MOSFET of second conductivity type which is provided at common sources of the second differential MOSFET pair and forms an operating current, constitute a second amplifying unit. A first output unit including a first MOSFET pair of second conductivity type which supplies a current flowing through the first differential MOSFET pair, and a second output unit including a second MOSFET pair of first conductivity type which supplies a current flowing through the second differential MOSFET pair, are provided to constitute an amplifier circuit. A circuit similar to such an amplifier circuit is used to constitute a device circuit. A pair of output terminals thereof is connected in common to form a voltage corresponding to a middle point. Such a voltage is supplied to the gates of the first and second current source MOSFETs of the amplifier circuit, the gates of the first and second MOSFETs thereof, and the gates of the corresponding current source MOSFET and MOSFET of the bias circuit, whereby it is possible to realize speeding up and stability of the operation of an input circuit capable of responding to an input signal which changes within a range between a power supply voltage and a circuit ground potential.

What is claimed is:

1. A semiconductor integrated circuit device, comprising:
   a first amplifying unit including a first differential MOSFET pair of first conductivity type whose gates are respectively connected to a pair of first input terminals, and a first current source MOSFET of first conductivity type which is provided at common sources of the first differential MOSFET pair and forms an operating current for the first differential MOSFET pair;
   a second amplifying unit including a second differential MOSFET pair of second conductivity type whose gates are respectively connected to the pair of first input terminals, and a second current source MOSFET of second conductivity type which is provided at common sources of the second differential MOSFET pair and forms an operating current for the second differential MOSFET pair;
   a first circuit including a circuit having a first MOSFET pair of second conductivity type connected to a source-drain path of the first differential MOSFET pair, and a second MOSFET pair of first conductivity type connected to a source-drain path of the second differential MOSFET pair;

a third amplifying unit including a third differential MOSFET pair of first conductivity type whose gates are respectively connected to a pair of second input terminals, and a third current source MOSFET of first conductivity type which is provided at common sources of the third differential MOSFET pair and forms an operating current for the third differential MOSFET pair;

a fourth amplifying unit including a fourth differential MOSFET pair of second conductivity type whose gates are respectively connected to the pair of second input terminals, and a fourth current source MOSFET of second conductivity type which is provided at common sources of the fourth differential MOSFET pair and forms an operating current for the fourth differential MOSFET pair; and a second circuit including a circuit having a third MOSFET pair of second conductivity type connected to a source-drain path of the third differential MOSFET pair, and a circuit having a fourth MOSFET pair of first conductivity type connected to a source-drain path of the fourth differential MOSFET pair, wherein an output produced from the second circuit is supplied to the gates of the first through fourth current source MOSFETs and the gates of the first through fourth MOSFET pairs.

2. The semiconductor integrated circuit device according to claim 1, wherein drains of the first differential MOSFET pair and drains of the first MOSFET pair are connected, wherein drains of the second differential MOSFET pair and drains of the second MOSFET pair are connected, wherein a fifth MOSFET of second conductivity type and a sixth MOSFET of first conductivity type are connected in a series configuration between one of the first MOSFET pair and one of the second MOSFET pair, wherein a seventh MOSFET of second conductivity type and an eighth MOSFET of first conductivity type are included which are both connected in a series configuration between the other of the first MOSFET pair and the other of the second MOSFET pair, wherein drains of the third differential MOSFET pair and drains of the third MOSFET pair are connected, wherein drains of the fourth differential MOSFET pair and drains of the fourth MOSFET pair are connected, wherein a ninth MOSFET of second conductivity type and a tenth MOSFET of first conductivity type are included which are both connected in a series configuration between one of the third MOSFET pair and one of the fourth MOSFET pair, and wherein an eleventh MOSFET of second conductivity type and a twelfth MOSFET of first conductivity type are included which are both connected in a series configuration between the other of the third MOSFET pair and the other of the fourth MOSFET pair.

3. The semiconductor integrated circuit device according to claim 2, wherein the pair of first input terminals is supplied with a pair of input signals complementary to each other, and wherein the pair of second input terminals is supplied with a pair of input signals complementary to each other.

4. The semiconductor integrated circuit device according to claim 2, wherein one of the pair of first input terminals is supplied with an input signal, and the other thereof is supplied with a reference voltage for determining a level of the input signal, and wherein the pair of second input terminals is supplied with the reference voltage.

5. The semiconductor integrated circuit device according to claim 2, wherein sizes of the first, second MOSFET pairs and the fifth through eighth MOSFETs are respectively equal to or larger than those of the third, fourth MOSFET pairs and the ninth through twelfth MOSFETs.

6. The semiconductor integrated circuit device having a standby mode according to claim 2, further including:

a first switch circuit which separates the first circuit and the second circuit from each other in the standby mode;

a second switch circuit which brings the first through fourth current source MOSFETs to an off state; and a third switch circuit which supplies a power supply voltage to the gates of the first through fourth MOSFET pairs.

7. The semiconductor integrated circuit device according to claim 6, wherein the first switch circuit separates the first circuit and the second circuit from each other in said standby mode, and the second switch circuit brings the first through fourth current source MOSFETs to an off state in said standby mode.

8. A semiconductor integrated circuit device, comprising:

a flat amplifying unit including a first differential MOSFET pair of first conductivity type whose gates are respectively connected to a pair of first input terminals, and a first current source MOSFET of first conductivity type which is provided at common sources of the first differential MOSFET pair and forms an operating current for the first differential MOSFET pair;

a second amplifying unit including a second differential MOSFET pair of second conductivity type whose gates are respectively connected to the pair of first input terminals, and a second current source MOSFET of second conductivity type which is provided at common sources of the second differential MOSFET pair and forms an operating current for the second differential MOSFET pair;

a first output unit having a first MOSFET pair of second conductivity type which supplies a current flowing through the first differential MOSFET pair;

a second output unit having a second MOSFET pair of first conductivity type which supplies a current flowing through the second differential MOSFET pair, the drains of the first differential MOSFET pair of the first amplifying unit and drains of the first MOSFET pair of the first output unit being respectively connected, the drains of the second differential MOSFET pair of the second amplifying unit and drains of the second MOSFET pair of the second output unit being connected;

a fifth MOSFET of second conductivity type and a sixth MOSFET of first conductivity type which are provided between one of the first MOSFET pair of the first output unit and one of the second MOSFET pair of the second output unit and connected to a first output terminal; and a seventh MOSFET of second conductivity type and an eighth MOSFET of first conductivity type which are provided between the other of the first MOSFET pair of the first output unit and the other of the second MOSFET pair of the second output unit and connected to a second output terminal, wherein the first current source MOSFET is formed so as to be larger than MOSFETs of the first differential pair in on resistance value, and wherein the second current source MOSFET is formed so as to be larger than MOSFETs of the second differential pair in on resistance value.

9. The semiconductor integrated circuit device according to claim 8, further including a bias circuit (VBG) comprising:

a third amplifying unit including a third differential MOSFET pair of first conductivity type whose gates are respectively connected to a pair of second input terminals, and a third current source MOSFET of first conductivity type which is provided at common sources of the third differential MOSFET pair and forms an operating current for the third differential MOSFET pair;

a fourth amplifying unit including a fourth differential MOSFET pair of second conductivity type whose gates are respectively connected to the pair of second input terminals, and a fourth current source MOSFET of second conductivity type which is provided at common sources of the fourth differential MOSFET pair and forms an operating current for the fourth differential MOSFET pair;

a third output unit having a third MOSFET pair of second conductivity type which supplies a current flowing through the third differential MOSFET pair; and a fourth output unit having a fourth MOSFET pair of first conductivity type which supplies a current flowing through the fourth differential MOSFET pair, wherein outputs of said third and fourth output are supplied to gates of the first through fourth current source MOSFETs and gates of the first through fourth MOSFET pairs.

10. The semiconductor integrated circuit device according to claim 9, wherein the fifth through eighth MOSFETs are formed so as to be shorter than the first through fourth MOSFET pairs and the differential MOSFET pairs in gate length.

11. A semiconductor device, comprising:

a first voltage terminal which receives a first voltage therein;

a second voltage terminal which receives therein a second voltage larger than the first voltage; and an amplifier circuit, wherein the amplifier circuit includes a first circuit having a first input terminal, a second input terminal, and a first output terminal, and a second circuit having a third input terminal and a fourth input terminal, wherein the first circuit includes first through fifth transistors of first conductivity type, sixth through tenth transistors of second conductivity type different from the first conductivity type, a third circuit and a fourth circuit, wherein the second circuit includes eleventh through fifteenth transistors of the first conductivity type, sixteenth through twentieth transistors of the second conductivity type, a fifth circuit and a sixth circuit, wherein the first transistor includes a source connected to the second voltage terminal, wherein the second transistor includes a gate connected to the first input terminal, and a source connected to a drain of the first transistor, wherein the third transistor includes a source connected to the drain of the first transistor, wherein the fourth transistor includes a source connected to the second voltage terminal, wherein the fifth transistor includes a source connected to the second voltage terminal, wherein the sixth transistor includes a source connected to the first voltage terminal, wherein the seventh transistor includes a drain connected to a drain of the fourth transistor, a source connected to a drain of the sixth transistor, and a gate connected to the first input terminal, wherein the eighth transistor includes a drain connected to a drain of the fifth transistor, a source connected to the drain of the sixth transistor, and a gate connected to the second input terminal, wherein the ninth transistor includes a drain connected to a drain of the second transistor, and a source connected to the first voltage terminal, wherein the tenth transistor includes a drain connected to a drain of the third transistor, and a source connected to the first voltage terminal, wherein the third circuit includes a current path between the drain of the fourth transistor and the drain of the ninth transistor, and an output terminal connected to the first output terminal, wherein the fourth circuit includes a current path between the drain of the fifth transistor and the drain of the tenth transistor, wherein the eleventh transistor includes a source connected to the second voltage terminal, wherein the twelfth transistor includes a gate connected to the third input terminal and a source connected to a drain of the eleventh transistor, wherein the thirteenth transistor includes a source connected to the drain of the eleventh transistor, wherein the fourteenth transistor includes a source connected to the second voltage terminal, wherein the fifteenth transistor includes a source connected to the second voltage terminal, wherein the sixteenth transistor includes a source connected to the first voltage terminal, wherein the seventeenth transistor includes a drain connected to a drain of the fourteenth transistor, a source connected to a drain of the sixteenth transistor, and a gate connected to the third input terminal, wherein the eighteenth transistor includes a drain connected to a drain of the fifteenth transistor, a source connected to a drain of the sixteenth transistor, and a gate connected to the fourth input terminal, wherein the nineteenth transistor includes a drain connected to a drain of the twelfth transistor, and a source connected to the first voltage terminal, wherein the twentieth transistor includes a drain connected to a drain of the thirteenth transistor, and a source connected to the first voltage terminal, wherein the fifth circuit includes a current path between the drain of the fourteenth transistor and the drain of the nineteenth transistor, and an output terminal, wherein the sixth circuit includes a current path between the drain of the fifteenth transistor and the drain of the twentieth transistor, and an output terminal, and wherein gates of the fourth, fifth, ninth, tenth, fourteenth, fifteenth, nineteenth and twentieth transistors are connected to the output terminal of the fifth circuit and the output terminal of the sixth circuit.

12. The semiconductor device according to claim 11, wherein a gate of the first transistor and a gate of the eleventh transistor are connected to the second voltage terminal, and wherein a gate of the sixth transistor and a gate of the sixteenth transistor are connected to the first voltage terminal.

13. The semiconductor device according to claim 11, wherein the first voltage is a ground potential, and wherein the second voltage is a power supply voltage.

14. The semiconductor device according to claim 11, wherein the first input terminal is inputted with a first signal, wherein the second input terminal is inputted with a second signal used as a signal complementary to the first signal, wherein the third input terminal is inputted with the first signal, and wherein the fourth input terminal is inputted with the second signal.

15. The semiconductor device according to claim 11, wherein the first input terminal is inputted with a first signal, and wherein the second through fourth input terminals are inputted with a reference voltage.

16. The semiconductor device according to claim 11, wherein the first through tenth transistors are transistors identical in size to the eleventh through twentieth transistors.

17. The semiconductor device according to claim 11, wherein the first through tenth transistors are transistors larger in size than the eleventh through twentieth transistors respectively.

18. The semiconductor device according to claim 11, wherein the first conductivity type is a P conductivity type, wherein the second conductivity type is an N conductivity type, wherein the first through fifth and eleventh through fifteenth transistors are respectively P conductivity type MOSFETs, and wherein the sixth through tenth and sixteenth through twentieth transistors are respectively N conductivity type MOSFETs.

19. The semiconductor device according to claim 11, wherein the third circuit includes:

a twenty first transistor of the first conductivity type including a source connected to the drain of the fourth transistor, and a drain connected to the first output terminal; and a twenty second transistor of the second conductivity type including a dram connected to a drain of the twenty first transistor, and a source connected to the drain of the second transistor, wherein the fourth circuit includes:

a twenty third transistor of the first conductivity type including a source connected to the drain of the fifth transistor; and a twenty fourth transistor of the second conductivity type including a drain connected to a drain of the twenty third transistor, and a source connected to the drain of the third transistor, wherein the fifth circuit includes:

a twenty fifth transistor of the first conductivity type including a source connected to the drain of the fourteenth transistor, and a drain connected to the output terminal of the fifth circuit; and a twenty sixth transistor of the second conductivity type including a drain connected to the drain of the twenty fifth transistor, and a source connected to the drain of the twelfth transistor, the sixth circuit includes:

a twenty seventh transistor of the first conductivity type including a source connected to the drain of the fifteenth transistor, and a drain connected to the output terminal of the sixth circuit; and a twenty eighth transistor of the second conductivity type including a drain connected to the drain of the twenty seventh transistor, and a source connected to the drain of the thirteenth transistor, and wherein gates of the twenty first through twenty eighth transistors are respectively connected to the output terminal of the fifth circuit and the output terminal of the sixth circuit.

20. The semiconductor device according to claim 11, wherein gates of the fourth, fifth, ninth, tenth, fourteenth, fifteenth, nineteenth and twentieth transistors are respectively connected to the output terminal of the fifth circuit and the output terminal of the sixth circuit.

* * * * *